US006284584B1

(12) United States Patent
Hodges et al.

(10) Patent No.: US 6,284,584 B1
(45) Date of Patent: *Sep. 4, 2001

(54) METHOD OF MASKING FOR PERIPHERY SALICIDATION OF ACTIVE REGIONS

(75) Inventors: Robert Louis Hodges, Lewisville; Loi Ngoc Nguyen, Carrollton, both of TX (US)

(73) Assignee: STMicroelectronics, Inc., Carrollton, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/872,612

(22) Filed: Jun. 10, 1997

Related U.S. Application Data

(60) Division of application No. 08/482,979, filed on Jun. 7, 1995, now abandoned, which is a continuation-in-part of application No. 08/169,587, filed on Dec. 17, 1993, now Pat. No. 5,439,846.

(51) Int. Cl.$^7$ ................................................ H01L 21/8242

(52) U.S. Cl. ......................... 438/238; 438/649; 438/682

(58) Field of Search .................................. 438/268–259, 438/381–399, 275, 649, 682, 651, 655

(56) References Cited

U.S. PATENT DOCUMENTS

| 4,080,719 | 3/1978 | Wilting . |
| 4,102,733 | 7/1978 | De La Moneda et al. . |
| 4,128,670 | 12/1978 | Gaenssien . |
| 4,253,907 | 3/1981 | Parry et al. ........................ 156/643 |
| 4,354,896 | 10/1982 | Hunter et al. . |

(List continued on next page.)

FOREIGN PATENT DOCUMENTS

| 4102422 | * 8/1991 | (DE) . |
| 0185787 | * 7/1986 | (EP) . |
| 0111706 | * 12/1986 | (EP) . |
| 0265638 | 2/1987 | (EP) . |
| 0071029 | * 11/1987 | (EP) . |
| 0491408 | * 5/1989 | (EP) . |
| 0327412 | * 8/1989 | (EP) . |
| 1264257 | * 10/1989 | (EP) . |
| 0523856 | * 1/1993 | (EP) . |
| 0534130 | * 3/1993 | (EP) . |
| 2106315 | * 5/1978 | (GB) . |
| 2077993 | 9/1980 | (GB) . |
| 2083948 | * 9/1980 | (GB) . |
| 2167901 | * 10/1981 | (GB) . |

(List continued on next page.)

OTHER PUBLICATIONS

"Method to Produce Sizes in Openings in Photo Images Saller Than Lithographic Minimum Size," IBM Technical Disclosure Bulletin, vol. 29, No. 3 (1986).

Ishigaki, et al., "Low Parasitic Technologies With NES--SAC and SWT–CVD Process for Low Supply Voltage, High Speed BiCMOS SRAMs," 1994 Symposium on VLSI Technology Digest of Technical Papers, p. 99 (1994).

T. Fukase et al., "A Margin–Free Contact Process Using al Al$_2$O$_2$ Etch–Stop Layer for High Density Devices," IEDM, p. 837 (1992).

Armacos, et al., "Selective Oxide/Nitride Dry Etching in a High Density Plasma Reactor," Extended Abstracts, vol. 93–1, Spring Meeting (1993).

(List continued on next page.)

Primary Examiner—Jey Tsai
(74) Attorney, Agent, or Firm—Theodore E. Galanthay; Lisa K. Jorgenson; Daniel E. Venglarik

(57) ABSTRACT

An integrated circuit memory fabrication process and structure, in which salicidation is performed on the periphery (and optionally on the ground lines) of a memory chip, but not on the transistors of the memory cells.

6 Claims, 6 Drawing Sheets

U.S. PATENT DOCUMENTS

| | | | |
|---|---|---|---|
| 4,356,623 | 11/1982 | Hunter . | |
| 4,384,938 | 5/1983 | Desilets et al. | 204/298 |
| 4,398,335 | 8/1983 | Lehrer . | |
| 4,443,930 | 4/1984 | Hwang et al. . | |
| 4,470,189 | 9/1984 | Roberts et al. . | |
| 4,543,271 | 9/1985 | Peters | 427/54.1 |
| 4,622,735 | 11/1986 | Shibata . | |
| 4,654,112 | 3/1987 | Douglas et al. | 156/643 |
| 4,656,732 | 4/1987 | Teng et al. | 29/591 |
| 4,657,628 | 4/1987 | Holloway et al. | 156/643 |
| 4,660,278 | 4/1987 | Teng . | |
| 4,675,073 | 6/1987 | Douglas . | |
| 4,686,000 | 8/1987 | Health | 156/643 |
| 4,707,218 | 11/1987 | Giammarco et al. | 156/643 |
| 4,715,109 | 12/1987 | Bridges . | |
| 4,721,548 | 1/1988 | Morimoto | 156/657 |
| 4,755,476 | 7/1988 | Böhm et al. | 437/31 |
| 4,788,160 | 11/1988 | Havemann et al. . | |
| 4,792,534 | 12/1988 | Tsuji et al. . | |
| 4,801,350 | 1/1989 | Mattox et al. . | |
| 4,801,560 | 1/1989 | Wood et al. | 437/195 |
| 4,810,666 | 3/1989 | Taji | 437/30 |
| 4,818,335 | 4/1989 | Karnett . | |
| 4,824,767 | 4/1989 | Chambers et al. | 430/313 |
| 4,841,481 | 6/1989 | Ikeda | 257/903 |
| 4,894,351 | 1/1990 | Batty | 437/190 |
| 4,912,061 | 3/1990 | Nasr . | |
| 4,962,414 | 10/1990 | Liou et al. . | |
| 4,986,878 | 1/1991 | Malazgirt et al. | 156/643 |
| 4,988,423 | 1/1991 | Yamamoto et al. | 204/192.17 |
| 4,994,402 | 2/1991 | Chiu . | |
| 4,996,167 | 2/1991 | Chen . | |
| 5,003,062 | 3/1991 | Yen | 437/231 |
| 5,010,032 * | 4/1991 | Tang et al. | 437/57 |
| 5,027,185 | 6/1991 | Liauh . | |
| 5,030,585 | 7/1991 | Gonzalez et al. | 437/47 |
| 5,059,554 | 10/1991 | Spinner et al. . | |
| 5,061,646 | 10/1991 | Sivan et al. | 437/31 |
| 5,063,176 | 11/1991 | Lee et al. | 437/195 |
| 5,110,763 | 5/1992 | Matsumoto | 437/195 |
| 5,117,273 | 5/1992 | Stark et al. . | |
| 5,158,910 | 10/1992 | Cooper et al. . | |
| 5,166,088 | 11/1992 | Ueda et al. | 437/47 |
| 5,174,858 | 12/1992 | Yamamoto et al. . | |
| 5,200,808 | 4/1993 | Koyama et al. . | |
| 5,214,305 | 5/1993 | Huang et al. . | |
| 5,244,841 | 9/1993 | Marks et al. | 437/228 |
| 5,250,472 | 10/1993 | Chen et al. | 437/231 |
| 5,254,867 | 10/1993 | Fukuda et al. . | |
| 5,256,895 | 10/1993 | Bryant et al. . | |
| 5,260,229 | 11/1993 | Hodges et al. | 437/69 |
| 5,266,516 | 11/1993 | Ho | 437/57 |
| 5,266,525 | 11/1993 | Morozumi | 437/195 |
| 5,286,674 | 2/1994 | Roth et al. | 437/190 |
| 5,310,720 * | 5/1994 | Shin et al. | 437/231 |
| 5,320,983 * | 6/1994 | Ouellet | 437/231 |
| 5,321,211 * | 6/1994 | Haslam et al. | 174/262 |
| 5,323,047 | 6/1994 | Nguyen . | |
| 5,380,553 * | 1/1995 | Loboda | 427/226 |
| 5,411,917 * | 5/1995 | Forouhi | 437/195 |
| 5,439,846 | 8/1995 | Nugyen et al. . | |
| 5,478,772 * | 12/1995 | Fazan . | |
| 5,486,812 | 1/1996 | Arima | 257/296 |

FOREIGN PATENT DOCUMENTS

| | | |
|---|---|---|
| 54-107270 | 8/1979 | (JP) . |
| 56-164578 | 2/1981 | (JP) . |
| 56-8846 | 5/1981 | (JP) . |
| 59-159544 | 3/1984 | (JP) . |
| 60-58635 * | 4/1985 | (JP) . |
| 60-246675 * | 12/1985 | (JP) . |
| 61-232646 * | 10/1986 | (JP) . |
| 63-293946 * | 11/1988 | (JP) . |
| 64-82653 * | 4/1989 | (JP) . |
| 1264257 * | 10/1989 | (JP) . |
| 2-192724 * | 10/1990 | (JP) . |
| 3133131 * | 6/1991 | (JP) . |
| 4092453 * | 3/1992 | (JP) . |
| 4196486 * | 10/1992 | (JP) . |
| 5-74958 * | 3/1993 | (JP) . |
| 5-82751 * | 4/1993 | (JP) . |
| 5-267477 | 5/1993 | (JP) . |
| 61-26240 * | 5/1994 | (JP) . |
| 62-106645 * | 5/1997 | (JP) . |
| 89 01236 | 5/1990 | (WO) . |

OTHER PUBLICATIONS

Lau, et al., "A Super Self–Aligned Source/Drain MOSFET," IEDM, p. 358, (1987).

Wehner, et al., "The Nature of Physical Sputtering," Handbook of Thin Film Technology, p. 3–1, McGraw–Hill (1970).*

Gambino et al., "A $Si_3N_4$ Etch Stop Process for Borderless Contacts in 0.25 $\mu$m Devices," VMIC Conference, p. 558 (1995).*

Singer, "A New Technology for Oxide Contact and Via Etch," Semiconductor Int'l, p. 36 (1993).*

Jones, N.J. et al., "Salicide With Buried Silicide Layer," IBM Technical Disclosure Bulletin, 27(2), Jul. 1984, pp. 1044–1045.*

Wolf et al., "Silicon Processing for the VLSI Era," vol. 1, Lattice Press, 1986, pp. 384–399.*

Murarka, S.P. "Silicides for VLSI Applications," 1983, Academic press, pp. 164–167.*

H.T.G. Hentzell et al., "Formation of Aluminum Silicide Between Two Layers of Amorphous Silicon," Applied Physics Letters, vol. 50, No. 14, pp. 933–934, Apr. 1987.*

M. Lin et al., "An Environment–Insensitive Trilayer Structure for Titanium Silicide Formation," Journal of Electrochem. Soc., vol. 133, No. 11, pp. 2386–2389, Nov. 1986.*

S. Saitoh et al., "Formation of Double–Hetero $Si/CoSi_2/Si$ Structure Using Molecular Beam and Solid Phase Epitaxies," Jap. J. of Applied Physics, vol. 20, pp. 49–54, 1981.*

J.K. Howard, "High Conductivity Transition Metal Silicide ($NbSi_2$) for FET Gate Structures," IBM Technical Journal, vol. 22, No. 2, Jul. 1979.*

IBM Technical Disclosure Bulletin: "Dual Self–Aligned Silicides on FET Gates and Junctions", vol. 31, No. 7, Dec. 1988, p., 154.*

IBM Technical Disclosure Bulletin: "Separation of Gate Salicidation from the Source/Drain Salicidation", vol. 34, No. 10A, Mar. 1992, pp. 474–477.

"A Novel Borderless Contact/Inteconnect Technology Using Aluminum Oxide Etch Stop for High Performance SRAM and Logic," *Proceedings of the International Electron Devices Meeting,* Washington, D.C. 12/5–8/93, Institute of Electrical and Electronics Engineers, pp. 441–444.

"Etching—Applications and Trends of Dry Etching," *Handbook of Advanced Technology and Computer Systems at 27ff,* 1988, pp. 27–72.

"Doped Silicon Oxide Deposition by Atmospheric Pressure and Low Temperature Chemical Vapor Deposition Using Tetraethoxysilane and Ozone," *Journal of the Elctrochemical Society,* Oct. 1991, pp. 3019–3024.

"Hot–Carrier Aging of the MOS Transistor in the Presence of Spin–on Glass as the Interlevel Dielectric," *EEE Electron Device Letters,* vol. 12, No. 3, Mar. 1991, pp. 140–142.

"The Effect of Plasma Cure Temperature on Spin–on Glass," *J. Electrochem. Soc.,* vol. 140, No. 4, Apr. 1993, pp. 1121–1125.

"Three 'Low DT' Options for Planarizing the Pre–metal Dielectric on an Advanced Double Poly BiCMOS Process," *J. Electrochem. Soc.,* vol. 139, No. 2, Feb. 1992, pp. 532–536.

"Polysilicon Planarization Using Spin–On Glass," *J. Electrochem. Soc.,* vol. 139, No. 2, Feb. 1992, pp. 591–599.

"Plasma Etch Anisotropy—Theory and Some Verifying Experiments Relating Ion Transport, Ion Energy, and Etch Profiles," *J. Electrochem. Soc.: Solid State Science and Technology,* May 1993, pp. 1144–1152.

"Advantages of Using Spin–on–Glass Layer in Interconnection Dielectric Planarization," *Microelectronic Engineering,* Dec. 1986, Nos. 1–4, pp. 413–421.

"Method for Reducing the Diffusion Contact Borders," *IBM Technical Disclosure Bulletin,* Sep. 1989, vol. 32, No. 4A, pp. 344–345.

"Silicon processing for the VLSI era," *Vol. 2: Process Integration,* 1990, pp. 273–275.

"VLSI Fabrication Principles," S.K. Ghandi, Wiley & Sons, pp. 479–482 and 499–501.

"VLSI Electronics Microstructure Science," *Plasma Processing for VLSI:* vol. 8, 1984, pp. 298–339.

Device Physics (A Handbook of Semiconductors, vol. 4), 1981, pp. 208–209.

"Methods of Forming Small Contact Holes," *IBM Technical Disclosure Bulletin,* vol. 30, No. 8, Jan. 1988, pp. 252–253.

* cited by examiner

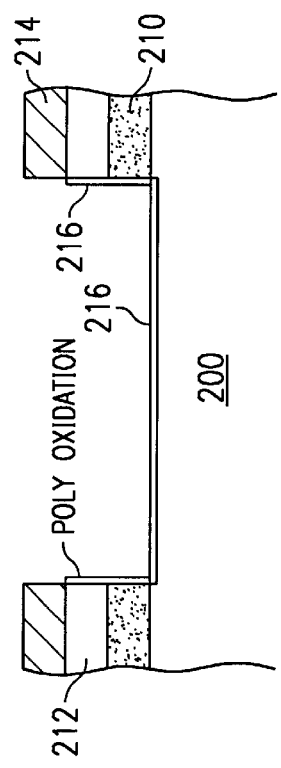
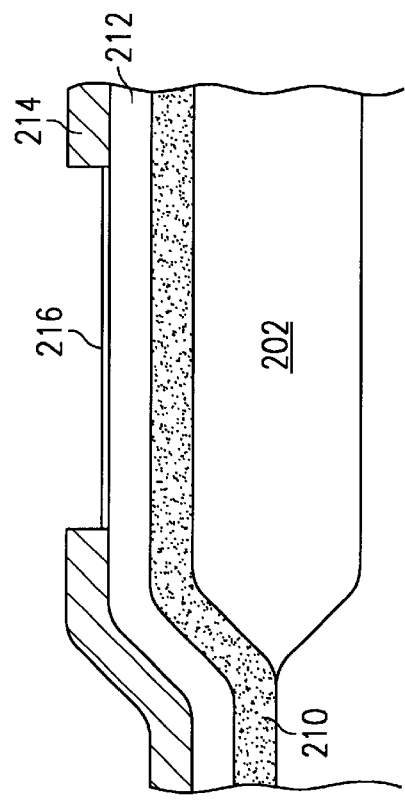
FIG. 4A
FIG. 4B
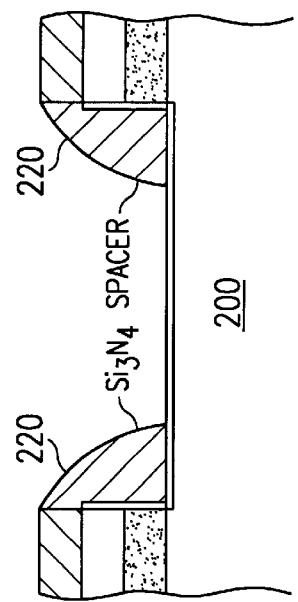
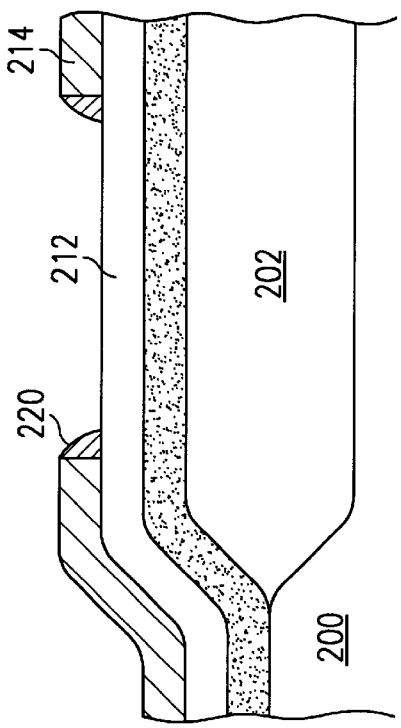
FIG. 5A
FIG. 5B

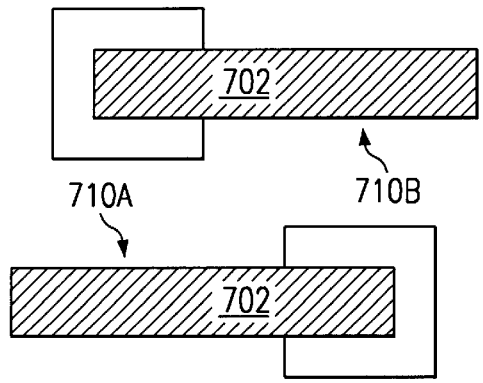
2. POLY-1
3. FPCC
FIG. 7B
FIG. 7C
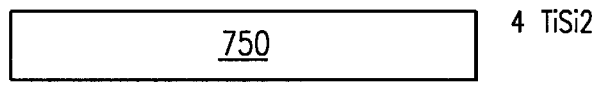
4 TiSi2
FIG. 8
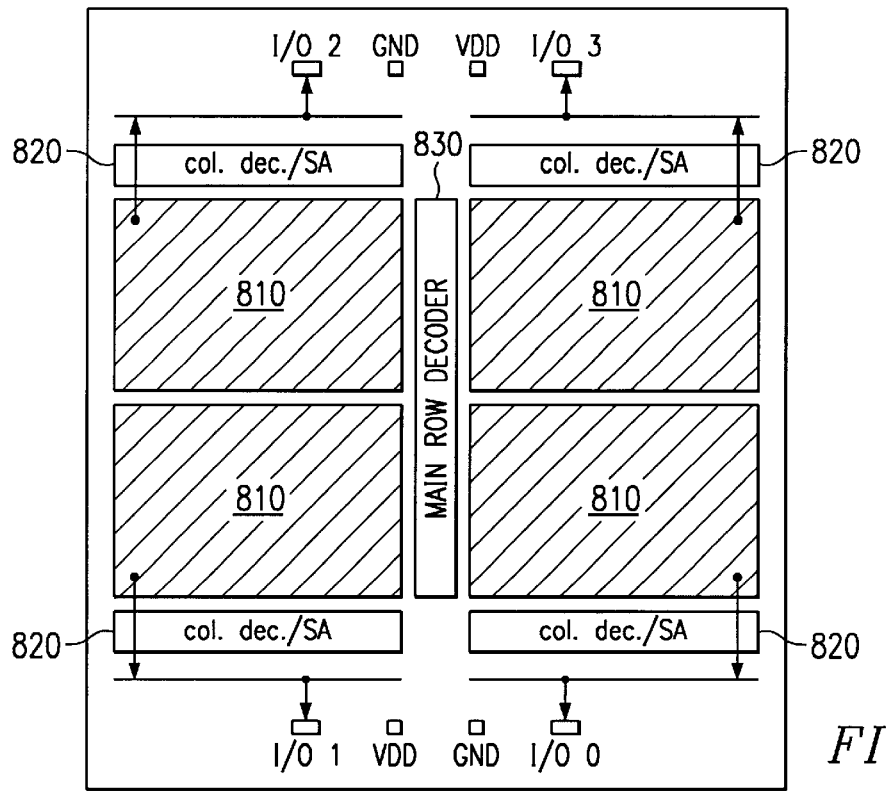

METHOD OF MASKING FOR PERIPHERY SALICIDATION OF ACTIVE REGIONS

CROSS REFERENCE TO RELATED APPLICATION

This is a Division, of application Ser. No. 08/482,979, filed Jun. 7, 1995, now abandoned, which is a continuation-in-part of application Ser. No. 08/169,587, filed Dec. 17, 1993 now U.S. Pat. No. 5,439,846.

BACKGROUND AND SUMMARY OF THE INVENTION

The present application relates to integrated circuit memory chips, and particularly to chips which include low-power SRAM cells.

Sheet Resistance and Clock Speed

The patterned thin-film layers which are used for conduction in integrated circuit devices will typically have a very significant distributed resistance and capacitance, which imposed a significant time constant on signals routed through such layers.

The RC time constant of the gate can be reduced by making metal contact to the gate in more places. This effectively reduces the "R" term in the time constant. However, each such contact consumes some gate area. Moreover, in single-level-metal processes, the requirements of making source contacts severely constrain the possible geometries for gate contacts.

Silicides and Conductive Nitrides

One general technique for improving the conductivity of silicon and polysilicon layers is to clad them with a metal silicide and/or a conductive nitride (usually TiN). Many different metal silicides have been proposed for use; among the most common are titanium, cobalt, tantalum, tungsten, nickel, and molybdenum silicide.

One particularly convenient way to provide suicides is to use a self-aligned process, in which a metal is deposited overall and heated to react it with exposed silicon. The unreacted metal can then be stripped off. Such process are known as "saliciding."

Salicidation is not without costs and risks. With shallow source/drain depths, salicidation may lead to increased leakage. The potential problems are reviewed, for example, in S. Wolf, II SILICON PROCESSING FOR THE VLSI ERA at 142–152 (1990). Thus silicidation is often avoided in high-density low-power memories.

Innovative Structures and Methods

The disclosed inventions provide an integrated circuit memory fabrication process and structure, in which salicidation is performed on the periphery (and optionally on the ground lines) of a memory chip, but not on the transistors of the memory cells. This avoids leakage in the array, while preserving maximal speed in the peripheral logic.

This is advantageously, but not necessarily, used in combination with the sidewall nitride process disclosed in the parent application, which provides a self-aligned zero-offset contact process.

BRIEF DESCRIPTION OF THE DRAWING

The disclosed inventions will be described with reference to the accompanying drawings, which show important sample embodiments of the invention and which are incorporated in the specification hereof by reference, wherein:

FIGS. 2A–5A show sequential process steps along section A—A of FIG. 1, and corresponding FIGS. 2B–5B show the same sequence of process steps along section B—B of FIG. 1.

FIGS. 7A–7C are overlaid views of key mask portions of an SRAM cell in which self-aligned salicide cladding is present on diffusions which are used for VSS routing, but is not present on the source/drain diffusions of the transistors of the memory cells.

FIG. 8 is a floor plan of an SRAM chip, in which self-aligned salicide cladding is present on the peripheral transistors, but not on the transistors of the memory cells.

DETAILED DESCRIPTION OF THE PREFERRED EMBODIMENTS

The numerous innovative teachings of the present application will be described with particular reference to the presently preferred embodiment (by way of example, and not of limitation), in which:

In the presently preferred embodiment, the claimed silicidation ideas are used in combination with the nitride and spacer innovations described in the parent application. However, it must be understood that the innovative silicidation ideas are not necessarily tied to this context.

Figure 1:
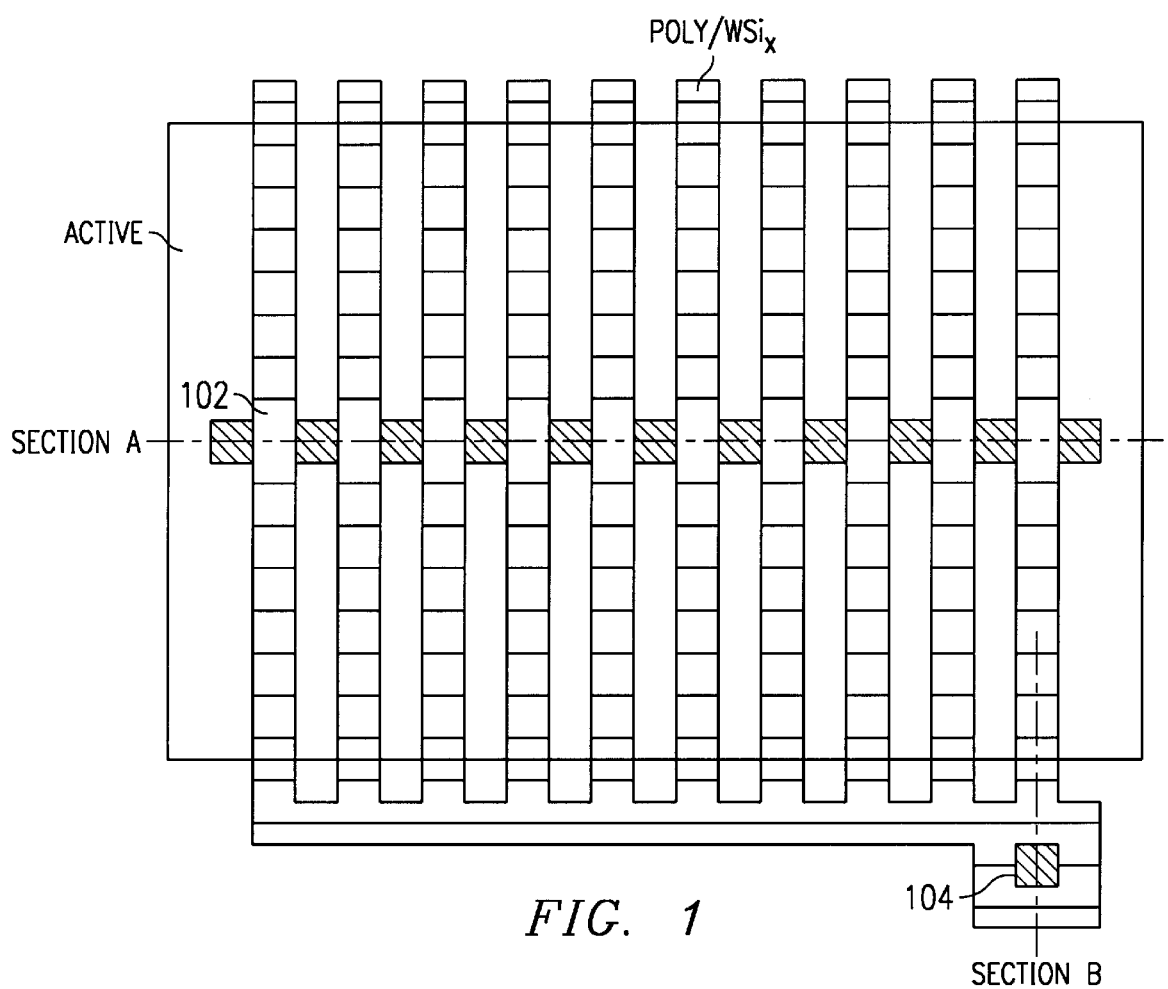
FIG. 1 shows a simple example of an integrated circuit structure.

FIG. 1 shows a simple example of an integrated circuit structure. (As will be recognized by those skilled in the art, this is a simplified example of a device structure, which includes features in common with many high-density structures.) In this structure, a number of transistor locations 102 (i.e. locations where poly crosses over Active) occur along Section line A—A, and a first-poly-contact location 104 where contact is made to poly over field oxide occurs along section line B—B. (Note that these first-poly-contact locations are NOT related to the "first contacts" or direct contacts which were sometimes used, in the 1970s and 1980s, to form contacts directly from first poly to active.) These first-poly-contact locations are shown as mask outline FPCC in FIG. 7B.

Figure 2A:
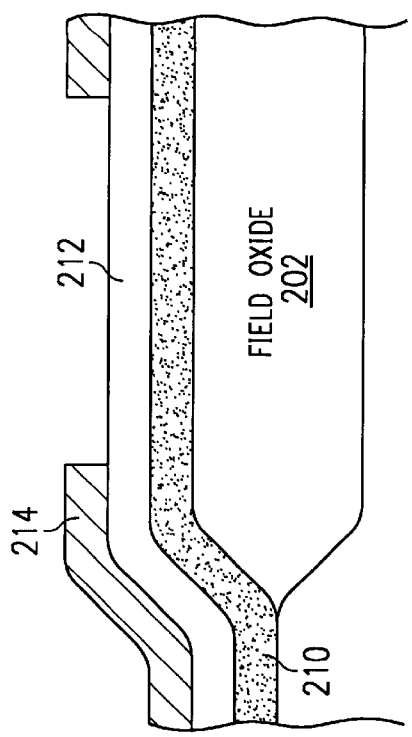
Figure 2B:
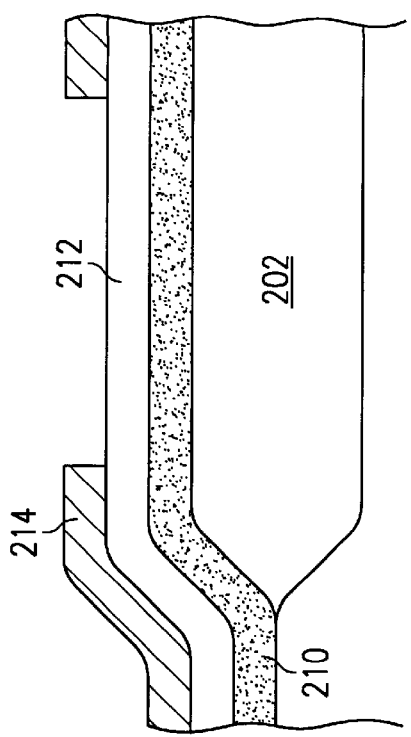
Figure 3A:
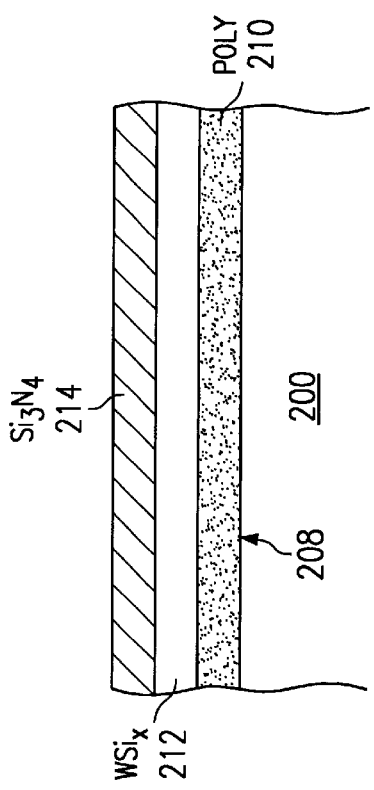
Figure 3B:
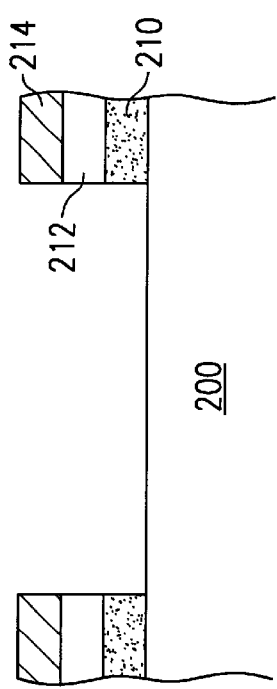

FIGS. 2A, 3A, 4A, etc. show sequential process steps at transistor gate sidewall locations 102 (along section A—A), and corresponding FIGS. 2B, 3B, 4B, etc., show the same sequence of process steps at first-poly-contact location 104 (along section B—B).

In FIG. 2B, note that an additional mask (the "FPC" mask) is used to remove the nitride etch stop in locations where a contact to poly will be required.

After conventional beginnings (preparation of silicon wafer 200, formation of N-wells and P-wells, formation of field oxide 202 to e.g. 5000 Å, sacrificial oxide grown and stripped, gate oxide 203 grown to e.g. 150 Å, threshold voltage adjustment, etc. etc.), fabrication proceeds as follows:

1. Polysilicon 210 is deposited, e.g. to a thickness of 1500 Å, and doped.
2. Tungsten silicide ($WSi_x$) 212 is deposited by chemical vapor deposition (CVD) to a thickness of e.g. 1500 Å. (This polycide combination gives an eventual sheet resistance in the range of 4–5 Ω/□.)
3. $Si_3N_4$ layer 214 (or another suitable material, e.g. oxynitride, as discussed below) is deposited.
4. The First-poly-contact pattern (the "FPC" mask) is used to etch an opening through the nitride layer 214 in locations where contacts to the clad first-poly layer 210/212 will be formed over field oxide 202.

This results in the structure shown in FIGS. 2A and 2B.

5. The poly-1 mask is now used to pattern the gate polycide layer.

This results in the structure shown in FIGS. 3A and 3B.

6. A re-oxidation step (e.g. 5–30 minutes at a temperature of 800–900° C. in an atmosphere of $H_2O/N_2$ or $O_2/N_2$, in the presently preferred embodiment) is then performed to improve substrate protection. This grows an additional thickness of oxide 216 (e.g. 500 Å) on the exposed portions of the active area, as well as on exposed portions of the polysilicon 210 and silicide 212.

This results in the structure shown in FIGS. 4A and 4B.

7. A conventional LDD implant is then performed. Deep anti-punch-through implants may also be performed at this stage if desired.

8. $Si_3N_4$ is then deposited conformally (e.g. to a thickness of 1500 Å, in the presently preferred embodiment) and etched anisotropically, using an $SF_6+CF_4$ etch chemistry with endpoint detection, to produce sidewall spacers 220. Note that the height of the sidewall spacers 220 on the poly-1 sidewalls is greater than that of the gate polycide structure. Note that smaller spacers 220 also appear on the sidewalls of the FPC aperture, in addition to those on the poly-1 sidewalls.

This results in the structure shown in FIGS. 5A and 5B.

9. Masked n+ and p+ implants are now performed to form source/drain diffusions. The doses and energies are preferably selected to form junction depths of e.g. 0.1 to 0.15 microns for the n+ diffusions, and 15–0.2 microns for the p+ diffusions. In this sample embodiment, the doses and energies are such that the sheet resistance of the unclad diffusions would be about 60 $\Omega/\square$ for n+ and 130 $\Omega/\square$ for p+; but the clad diffusions have a sheet resistance of about 2.3 $\Omega/\square$ for n+ and about 2.0 $\Omega/\square$ for p+. (Of course these specific parameters can readily be changed as desired.) Conventional annealing is preferably now performed for dopant activation.

10. An oxide masking layer is now deposited overall. The thickness of this layer is not particularly critical, e.g. 100–1000 Å, or more specifically 300 Å in the presently preferred embodiment.

11. Resist is then patterned to expose the oxide mask layer over the periphery, and a plasma fluoro-etch is performed to remove this oxide mask layer from the periphery. The resist is then stripped.

12. An RCA cleanup is then performed (preferably using the formulations known to those skilled in the art as SC1 and SC2, followed by HF).

13. Titanium is then deposited overall, e.g. to a thickness of 400 Å, and, in the presently preferred embodiment, TiN is then deposited thereon by CVD to a thickness of 300 Å.

14. An RTA anneal is then performed (e.g. maintaining a peak temperature of about 730° C. for about 20 sec). This forms titanium silicide 610 over exposed silicon and polysilicon, and TiN over oxide. (Optionally, of course, a furnace anneal can be used instead of the RTA steps.)

15. The TiN is then stripped in an $NH_4OH/H_2O_2H_2O$ solution.

16. A second RTA anneal is then performed (e.g. maintaining a peak temperature of about 850° C. for about 20 sec). This lowers the sheet resistance of the titanium silicide.

Figure 6:
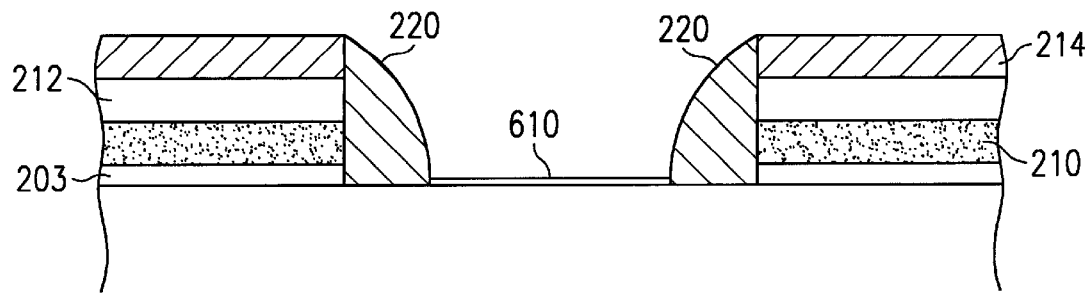
FIG. 6 shows a gate corner structure in a transistor which includes two different silicides: one cladding the active areas, and a different silicide in the gate polycide.

These steps form silicided active areas in the periphery, as illustrated in FIG. 6. Note that two different suicides are present in this device structure: one silicide 610 clads the active areas, and the other silicide 212 is a part of the gate polycide structure. In the preferred embodiment, the first silicide 610 is a titanium silicide (optionally overlaid with TiN), and the second silicide is a tungsten silicide. Preferably the first silicide has a composition of approximately $TiSi_2$, and the second silicide has a composition of approximately $WSi_2$.

Conventional processing now resumes. For example, an interlevel dielectric (e.g. BPSG over undoped silica glass) is now deposited, and is etched using an oxide etch chemistry which is selective to $Si_3N_4$. In the presently preferred embodiment, this performed using a fluoro-etch with sacrificial silicon in the chamber. See Singer, "A New Technology for Oxide Contact and Via Etch", SEMICONDUCTOR INTERNATIONAL, August 1993, p.36, which is hereby incorporated by reference. Metal is now deposited, patterned, and etched to form a desired interconnect pattern. A wide variety of conventional metallization structures may be used, e.g. Al:1% Si:1% Cu, or a Ti/W/Al stack, or other known thin film recipes. Processing may then continue with conventional further steps, e.g. deposition of a further interlevel dielectric and a second metal layer (if desired), contact sinter (if needed), deposition and densification of a protective overcoat and removal thereof to expose contact pad locations. Processing may include additional conventional steps to complete fabrication, e.g. deposition and planarization of further interlevel dielectric, via patterning, second metal deposition and etch, protective overcoat deposition, etching contact pad apertures, etc. etc. See generally, e.g., VLSI TECHNOLOGY (2.ed. Sze 1988); G. Anner, PLANAR PROCESSING PRIMER (1990); R. Castellano, SEMICONDUCTOR DEVICE PROCESSING (1991); W. Runyan & K. Bean, SEMICONDUCTOR INTEGRATED CIRCUIT PROCESSING TECHNOLOGY (1990 ed.); S. Wolf, SILICON PROCESSING FOR THE VLSI ERA (1985, 1990); and the annual proceedings of the IEDM conferences for years 1979 to date; all of which are hereby incorporated by reference.

Figure 7A:
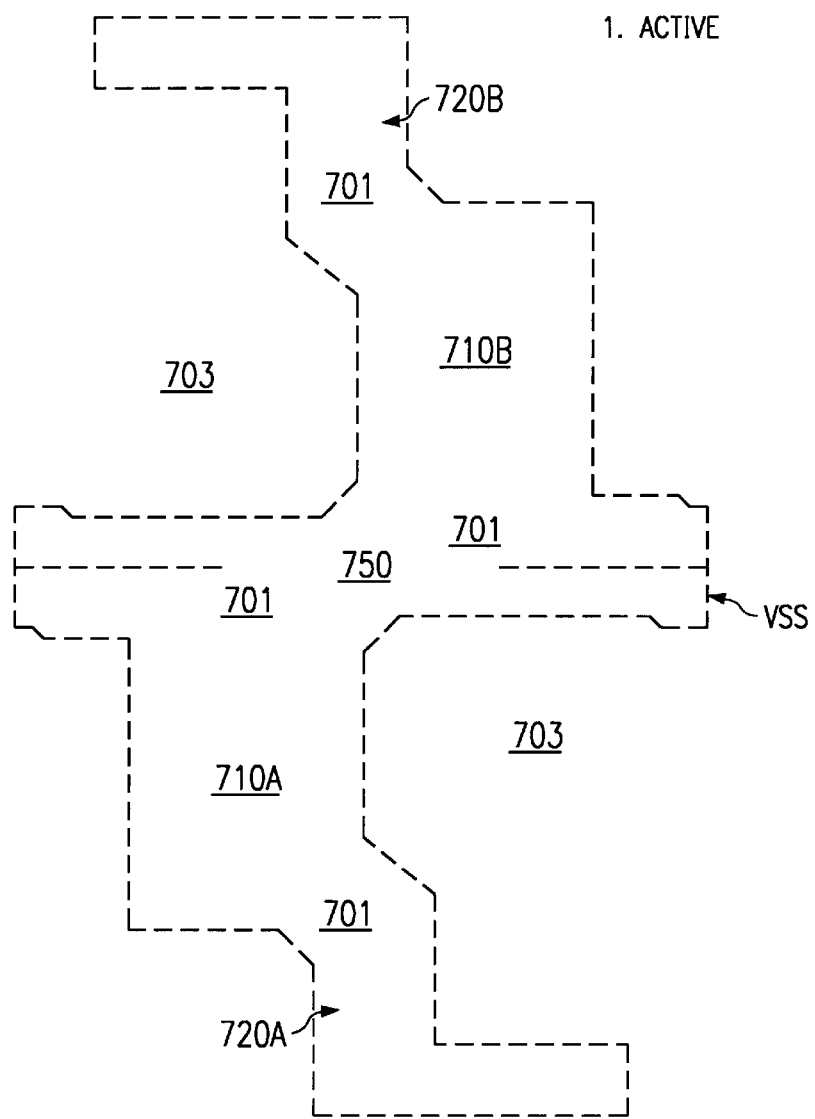

FIGS. 7A–7C are overlaid views of key mask portions of an SRAM cell in which self-aligned salicide cladding is present on diffusions which are used for VSS routing, but is not present on the source/drain diffusions of the transistors of the memory cells. These Figures are all parts of a single drawing, and are drawn to a common scale, but are separated here for clarity.

FIG. 7A shows the active pattern, i.e. the pattern of areas 701 where field oxide 703 is not present, and where transistors can consequently be formed. The sample layout shown is a 4T cell which includes two cross-coupled NMOS driver transistors 710A and 710B, and two NMOS pass transistors 720A and 720B. Note that the long horizontal active portion 750 at the center of the cell is used for routing VSS (ground) through multiple cells, and will be silicided as shown in FIG. 7C. The channel locations of transistors 710A, 710B, 720A, and 720B are also generally indicated.

FIG. 7B shows two additional masks, FPCC and poly-1. The polycide layer 702 provides the gates of transistors 710A, 710B, 720A, and 720B. Portions at top and bottom (marked WL) provide word lines, and gate the pass transistors 720. An n+ implant will dope all of the active areas 701 n+. except where covered by the polysilicon layer 702 (and its sidewall spacers).

FIG. 7C shows the pattern of the active portion 750 which is used for routing VSS (ground) through multiple cells.

Additional structures, not shown, provide cross-connections between the driver transistors 710 and complete the SRAM cell. For example, an additional polysilicon layer provides the resistive loads and the connection to the positive power supply.

FIG. 8 is a floor plan of a 4T SRAM chip, in which self-aligned salicide cladding is present on the peripheral transistors, but not on the transistors of the memory cells. This sample embodiment is a 16M chip which is organized as 4M×4, but of course other organizations can be used. This sample embodiment includes four subarrays 810 (illustrated with hatching) which are protected from the salicidation. Peripheral circuits, such as row decoders 830 and column-decode/sense-amplifier circuitry 820, provide data access to the memory cells.

Figure 9:
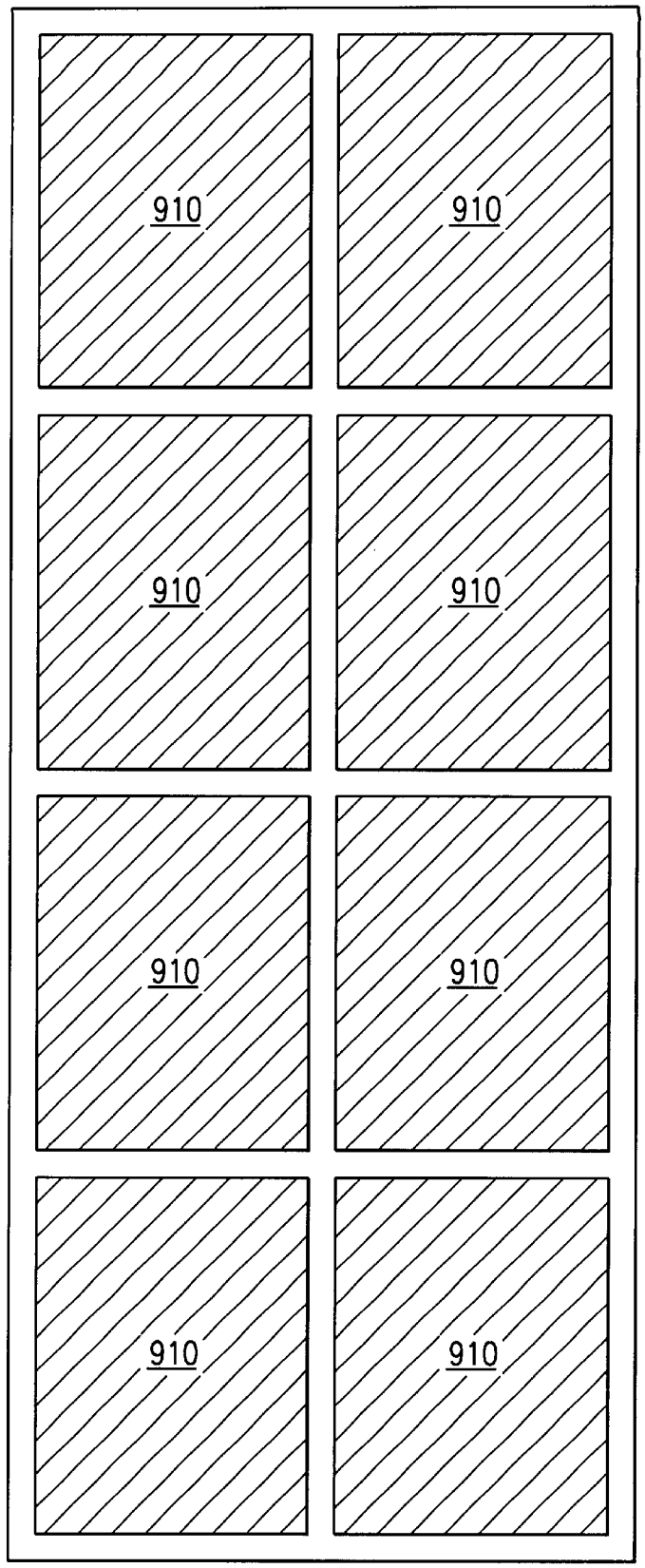
FIG. 9 is a floor plan of a DRAM chip, in which self-aligned salicide cladding is present on the peripheral transistors, but not on the pass transistors of the memory cells.

FIG. 9 is a floor plan of a DRAM chip, in which self-aligned salicide cladding is present on the peripheral transistors, but not on the pass transistors of the memory cells. This sample embodiment includes eight subarrays 910 (illustrated with hatching). Each subarray includes 2M 1T memory cells, and is protected from the salicidation. The peripheral circuits, such as row decoders, column-decoders, sense-amplifiers, input latches, and output buffers, are all conventional and not separately indicated.

Modifications and Variations

As will be recognized by those skilled in the art, the innovative concepts described in the present application can be modified and varied over a tremendous range of applications, and accordingly the scope of patented subject matter is not limited by any of the specific exemplary teachings given. For example, as will be obvious to those of ordinary skill in the art, other circuit elements can be added to, or substituted into, the specific circuit topologies shown.

Of course, the specific etch chemistries, layer compositions, and layer thicknesses given are merely illustrative, and do not by any means delimit the scope of the claimed inventions.

For example, many of the disclosed innovations are not limited to processes like those of FIGS. 1–5B, nor even to analogous processes, but can be used in a huge variety of integrated circuit processes.

For another example, the sidewall spacers do not necessarily have to be silicon nitride, but in some alternative embodiments can be silicon dioxide or another dielectric.

The invention can also be used with other deposited suicides instead of $TaSi_2$, including for example, without limitation, silicides of tungsten, molybdenum, palladium, platinum, cobalt, nickel, chromium, hafnium, titanium or vanadium.

The invention can also be used with other salicided silicides instead of $TiSi_2$, including for example, without limitation, silicides of cobalt, nickel, or vanadium.

Similarly, the nitride sidewall spacers of the presently preferred embodiment are not strictly necessary to the practice of the invention.

While the inventions have been described with primary reference to a single-poly process, it will be readily recognized that these inventions are equally applicable to double-poly or triple-poly structures and processes.

Similarly, it will be readily recognized that the described process steps can also be embedded into hybrid process flows, such as BiCMOS or smart-power processes.

It should also be understood that the disclosed innovations can be applied to a wide variety of integrated circuits. However, the use of array-masked salicidation is most attractive in battery backed SRAMs (whether 4T, 6T, or with TFT loads).

According to a disclosed class of innovative embodiments, there is provided: An integrated circuit memory, comprising: an array of memory cells; and peripheral circuits, include sense amplifiers and address decode logic, connected to provide data access to said cells from external pins; wherein at least some portions of said peripheral circuits include field-effect transistors having gates formed from a patterned conductive thin-film layer and having source/drain regions of a first conductivity type which are clad with a self-aligned metal silicide layer; and wherein at least some portions of said memory cells include field-effect transistors having gates formed from said conductive thin-film layer and having source/drain regions of said first conductivity type which are not clad with a self-aligned metal silicide layer.

According to another disclosed class of innovative embodiments, there is provided: An integrated circuit memory, comprising: a array of memory cells, individual ones of said cells being connected to be powered by first and second supply voltages, and including a pair of field-effect driver transistors having source/drain regions thereof provided by diffusions in a substantially monocrystalline semiconductor material, said driver transistors being cross-coupled to pull a pair of complementary data nodes toward said first supply voltage; a pair of load elements connected to pull at least one of said data nodes toward said second supply voltage; and at least one pass transistor connected to selectably provide access to one of said data nodes; and peripheral circuits, include sense amplifiers and address decode logic, connected to provide data access to said cells from external pins; wherein at least some portions of said peripheral circuits include field-effect transistors having source/drain regions thereof provided by diffusions in said semiconductor material which are clad with a self-aligned metal silicide layer; and wherein said source/drain regions of said driver transistors are not clad with a self-aligned metal silicide layer.

According to another disclosed class of innovative embodiments, there is provided: An integrated circuit memory, comprising: an array of memory cells, individual ones of said cells being connected to be powered by first and second supply voltages, and including a pair of field-effect driver transistors having source/drain regions thereof provided by diffusions in a substantially monocrystalline semiconductor material, said driver transistors being cross-coupled to pull a pair of complementary data nodes toward said first supply voltage; a pair of load elements connected to pull at least one of said data nodes toward said second supply voltage; and at least one pass transistor connected to selectably provide access to one of said data nodes; peripheral circuits, include sense amplifiers and address decode logic, connected to provide data access to said cells from external pins; wherein at least one said supply voltage is routed to said cells through diffusions which are clad with a self-aligned metal silicide layer; and wherein said source/drain regions of said driver transistors are not clad with a self-aligned metal silicide layer.

According to another disclosed class of innovative embodiments, there is provided: An integrated circuit memory, comprising: an array of memory cells, individual ones of said cells including field-effect transistors having source/drain regions thereof provided by diffusions in a substantially monocrystalline semiconductor material, individual ones of said cells being connected to be powered by first and second supply voltages; and peripheral circuits, include sense amplifiers and address decode logic, connected to provide data access to said cells from external pins;

wherein at least one said supply voltage is routed to said cells through diffusions which are clad with a self-aligned metal silicide layer.

According to another disclosed class of innovative embodiments, there is provided: A fabrication method, comprising the steps of: a) providing a substrate having monocrystalline semiconductor material in active areas, at a first surface thereof, which are laterally separated by isolation regions; b) forming a patterned gate layer overlying and capacitively coupled to portions of ones of said active areas, in locations which define transistor portions of memory cells and also define transistor portions of peripheral logic; c) forming self-aligned dielectric spacers along the edges of said thin-film layer; and d) depositing and reacting a metal on at least some ones of said active areas, to form a metal silicide at the surfaces of said active areas; wherein a masking step is used in connection with said step d.), in locations such that said step (d.) ultimately provides said metal silicide in said transistor portions of said peripheral logic, but not in said transistor portions of said memory cells.

What is claimed is:

1. A fabrication method, comprising the steps of:
   (a.) providing a substrate having monocrystalline semiconductor material in active areas, at a first surface thereof, which are laterally separated by isolation regions;
   (b.) forming a patterned gate layer overlying and capacitively coupled to portions of ones of said active areas, in locations which define transistor portions of memory cells and also define transistor portions of peripheral logic;
   (c.) forming self-aligned dielectric spacers along the edges of said thin-film layer; and
   (d.) depositing and reacting a metal on at least some ones of said active areas, to form a metal silicide at the surfaces of said active areas;
   wherein a masking step is used in connection with said step (d.), in locations such that said step (d.) ultimately provides said metal silicide in said transistor portions of said peripheral logic, but not in said transistor portions of said memory cells.

2. A fabrication method, comprising the steps of: p1 (a.) providing a substrate having monocrystalline semiconductor material in active areas, at a first surface thereof, which are laterally separated by isolation regions;
   (b.) forming a patterned gate layer overlying and capacitively coupled to portions of ones of said active areas, in locations which define transistor portions of memory cells and also define transistor portions of peripheral logic;
   (c.) forming self-aligned dielectric spacers along the edges of said thin-film layer; and
   (d.) depositing and reacting a metal on at least some ones of said active areas, to form a metal silicide at the surfaces of said active areas;
   wherein a masking step is used in connection with said step (d.), in locations such that said step (d.) ultimately provides said metal silicide in said transistor portions of said peripheral logic, but not in said transistor portions of said memory cells.

3. A fabrication method, comprising the steps of:
   (a) providing a substrate having monocrystalline semiconductor material in active areas, at a first surface thereof, which are laterally separated by isolation regions;
   (b) forming a patterned gate layer overlying and capacitively coupled to portions of ones of said active areas, in locations which define transistor portions of memory cells and also define transistor portions of peripheral logic;
   (c) forming self-aligned dielectric spacers along the edges of said thin-film layer; and
   (d) depositing and reacting titanium on at least some ones of said active areas, to form a titanium silicide at the surfaces of said active areas;
   wherein a masking step is used in connection with said step (d), in locations such that said step (d) ultimately provides said titanium silicide in said transistor portions of said peripheral logic, but not in said transistor portions of said memory cells.

4. The method of claim 3, comprising the further step of depositing titanium nitride over the titanium silicide.

5. A fabrication method, comprising the steps of:
   (a) providing a substrate having monocrystalline semiconductor material in active areas, at a first surface thereof, which are laterally separated by isolation regions;
   (b) forming a patterned gate layer overlying and capacitively coupled to portions of ones of said active areas, in locations which define transistor portions of memory cells and also define transistor portions of peripheral logic;
   (c) forming self-aligned dielectric spacers along the edges of said thin-film layer; and
   (d) depositing and reacting titanium on at least some ones of said active areas, to form a titanium silicide at the surfaces of said active areas;
   wherein a masking step is used in connection with said step (d), in locations such that said step (d) ultimately provides said titanium silicide in said transistor portions of said peripheral logic, but not in said transistor portions of said memory cells.

6. The method of claim 5, comprising the further step of depositing titanium nitride over the titanium silicide.

* * * * *